United States Patent

Harada et al.

Patent Number: 5,830,620
Date of Patent: Nov. 3, 1998

[54] WATER DEVELOPABLE FLEXOGRAPHIC PRINTING PLATE

[75] Inventors: Masahiko Harada, Settsu; Masataka Iwasaki, Osaka, both of Japan

[73] Assignee: Nippon Paint Co., Ltd., Osaka, Japan

[21] Appl. No.: 713,030

[22] Filed: Sep. 12, 1996

[30] Foreign Application Priority Data

Sep. 12, 1995 [JP] Japan .................................. 7-234039

[51] Int. Cl.$^6$ ........................................................ G03F 7/11
[52] U.S. Cl. ........................................ 430/272.1; 430/950
[58] Field of Search .............................. 430/272.1, 950, 430/273.1

[56] References Cited

U.S. PATENT DOCUMENTS

| | | | |
|---|---|---|---|
| 4,168,979 | 9/1979 | Okishi et al. ...................... | 430/273.1 |
| 5,039,592 | 8/1991 | Umeda .................................. | 430/271.1 |
| 5,294,474 | 3/1994 | Assante et al. ...................... | 430/273.1 |

FOREIGN PATENT DOCUMENTS 4143106  7/1992  Germany .............................. 430/273.1

OTHER PUBLICATIONS

Research Disclosure #18056, "A Light–Sensitive Material Having a Matting Layer", Apr. 1979, pp. 160–161.

*Primary Examiner*—Cynthia Hamilton
*Attorney, Agent, or Firm*—Wenderoth, Lind & Ponack

[57] ABSTRACT

The present invention provides a water developable flexographic printing plate for water-developing with a slip layer having excellent properties. The printing plate comprises a substrate, a photosensitive resin composition layer formed on the substrate, a slip layer formed on the photosensitive resin composition layer, and a cover film formed on the slip layer, wherein the slip layer is composed of hydroxyalkyl methyl cellulose, the cover film is a matted film containing silica, and an adhesive strength between the slip layer and the photosensitive resin composition layer is at least 20 g/50 mm higher than that between the cover film and the slip layer.

7 Claims, 1 Drawing Sheet

WATER DEVELOPABLE FLEXOGRAPHIC PRINTING PLATE

FIELD OF THE INVENTION

The present invention relates to a flexographic printing plate.

BACKGROUND OF THE INVENTION

Figure 1:
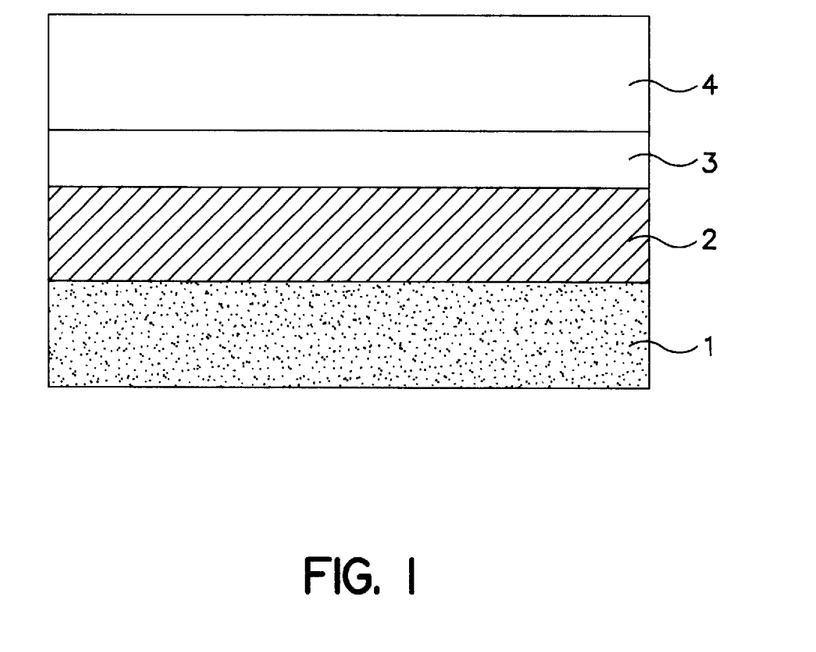
FIG. 1 schematically shows the construction of the printing plate of the present invention.

A flexographic printing plate which is commercially available, as shown in FIG. 1, generally comprises a substrate 1, a photosensitive resin composition layer 2 formed on the substrate 1, a slip layer 3 formed thereon and a cover film 4 provided for protecting the whole. When plate making, the cover film 4 is removed off and then a negative or positive film which is not shown in FIG. 1 is covered thereon, followed by exposing and developing.

The slip layer is present for easily removing the negative or positive film from the resin composition, after the sensitive resin composition for the film printing plate has been exposed through the negative or positive film, and also for providing high image quality. When there is no slip layer, it is practically impossible to adhere the negative or positive film to the surface of the photosensitive resin composition and to remove the film without injuring the surface of the resin composition. And the resulting image quality would also be deteriorated because of the defect present on the surface of the resin composition.

As the slip layer for a water developable flexographic printing plate, there are known so far polyvinyl alcohol (Japanese Kokai Publication Sho 58 (1983)–18633), polyamide (Japanese Kokai Publication Sho 56 (1981)-110941), hydroxyalkyl cellulose (Japanese Kohyo Publication Hei 5 (1993)-501314), hydroxyalkyl methyl cellulose and the like.

The slip layer for the flexographic printing plate can be formed by coating a slip layer solution on a cover film and drying, followed by adhering it to the photosensitive resin composition layer under pressure. When exposing and developing, the cover film is peeled off, but the slip layer remains on the surface of the photosensitive resin layer. Therefore, an optimal balance of adhesion and peeling should exist between the slip layer and the cover film used, and between the slip layer and the photosensitive resin composition. The slip layer should also give high image quality, and the slip layer coated on the cover film should be of high appearance without pinholes, unevenness, craters or the like.

Accordingly, the slip layer for the water developable flexographic printing plate should have the following properties.

a) Soluble or swellable in aqueous solution.
b) Substantially immiscible with ethylenic unsaturated monomers in the photosensitive resin composition layer for flexographic printing plate.
c) Flexible.
d) Transparent, nonsticky and coatable to the cover film, but it shows appropriate adhesion to both of the cover film and the photosensitive resin composition and, when it is coated onto the cover film and dried, it adheres to the cover film. When the cover film is removed off prior to exposure, it sufficiently adheres to the photosensitive resin composition and migrates from the cover film onto the photosensitive resin composition layer.
e) To provide high image quality.

SUMMARY OF THE INVENTION

The present invention is to provide a water developable flexographic printing plate with a slip layer satisfying the above properties. The water developable flexographic printing plate comprises a substrate, a photosensitive resin composition layer formed on the substrate, a slip layer formed on the photosensitive resin composition layer, and a cover film formed on the slip layer, wherein the slip layer is composed of hydroxyalkyl methyl cellulose, the cover film is a matted film containing silica, and an adhesive strength between the slip layer and the photosensitive resin composition layer is at least 20 g/50 mm higher than that between the cover film and the slip layer.

DETAILED DESCRIPTION OF THE INVENTION

The substrates used for the printing plate of the present invention can be any one which has been available for the flexographic printing plates so far. Polyethylene film is preferred as one of illustrative examples of the substrates.

The photosensitive resin composition layer is formed on the substrate. The photosensitive resin composition can be those which have been used so far for flexographic printing. Examples of such photosensitive resin compositions are those described in U.S. Pat. Nos. 4,323,637 and 4,956,252, etc. The photosensitive resin composition layer can be generally prepared by extruding a mixture of the composition on a substrate. For improving the adhesive strength between the photosensitive resin composition and the substrate, an adhesive agent layer is provided therebetween. The adhesive agent includes polyesters, polyethers, polyurethanes adhesives, their mixtures, and the like.

The photosensitive resin compositions which have already been known to the art, as described above, may be used, but the following is preferred in view of adhesive strength with the slip layer: The composition contains as essential ingredients:

(A) a hydrophilic crosslinked particulate copolymer prepared by polymerizing a monomer mixture consisting of
(1) 10–95 mol % of an aliphatic conjugated diene,
(2) 0.1–30 mol % of a monomer containing one or more functional groups selected from the group consisting of carboxyl group, hydroxy group, sulfonic acid group and phosphoric acid group,
(3) 0.1–20 mol % of a monomer having two or more addition polymerizable groups except for the aliphatic conjugated diene monomer (1), total of the components (1), (2), (3) and (4) being 100 mol %,
(B) a thermoplastic block copolymer having X-Y-X type or X-Y type structure and containing 1–40 mol % of a thermoplastic nonelastomer block X showing a glass transition temperature of 20° C. or more and 60–99 mol % of an elastomer Y showing a glass transition temperature of 10° C. or less,
(C) a basic nitrogen atom-containing compound,
(D) a photopolymerizable unsaturated monomer, and
(E) a photopolymerization initiator,
and the adhesive strength of the photosensitive resin composition layer to the slip layer is more than 30 g/50 mm.

Monomer (1) which constitutes the hydrophilic crosslinked particulate copolymer (A) is an aliphatic conjugated diene monomer, for example 1,3-butadiene, isoprene, 2,3-dimethyl-1,3-butadiene, chloroprene and the like. The aliphatic conjugated monomer preferably contains 4–6 carbon atoms, more preferably 4–5 carbon atoms.

A content of the monomer (1) in the crosslinked particulate copolymer (A) preferably is 10–95 mol %, more preferably 30–90 mol %. If the content of the ingredient (1) is below 10 mol %, the cured composition would show poor strength. If it exceeds 95 mol %, the water developability of the photosensitive resin composition would be lowered.

Monomer (2) which constitutes the copolymer (A) is a monomer having one or more functional groups selected from the group consisting of carboxyl group, hydroxy group, sulfonic acid group and phosphoric acid group.

The monomer containing carboxyl group illustratively includes unsaturated monocarboxylic acids, such as (meth) acrylic acid, crotonic acid, cinnamic acid, or the like; unsaturated polycarboxylic acids such as maleic acid (anhydride), fumaric acid, itaconic acid (anhydride), citraconic acid, mesaconic acid, or the like; esters containing free carboxyl group of the unsaturated polycarboxylic acids; nitriles containing free carboxyl group of the unsaturated polycarboxylic acids; and amides containing free carboxyl group of the unsaturated polycarboxylic acids.

The monomer containing hydroxy group illustratively includes mono(meth)acrylates of polyhydric alcohols, such as 2-hydroxyethyl (meth)acrylate, 2-hydroxypropyl (meth) acrylate, 3-hydroxypropyl (meth)acrylate, 3-chloro-2-hydroxypropyl (meth)acrylate, 2-hydroxybutyl (meth) acrylate, 3-hydroxybutyl (meth)acrylate, 4-hydroxybutyl (meth)acrylate, glycerol mono (meth)acrylate, polyalkylene glycol mono(meth)acrylate (unit number of polyalkylene glycol can be 2–12) or the like: unsaturated amides containing hydroxy group, such as N-hydroxymethyl (meth) acrylamide, N-2-hydroxyethyl (meth)acrylamide, N-2-hydroxypropyl (meth)acrylamide, N-3-hydroxypropyl (meth)acrylamide or the like; and unsaturated alcohols, such as (meth)allyl alcohol or the like.

The monomer containing sulfonic acid group illustratively includes vinylsulfonic acid, 2-acrylamido-2-methylpropanesulfonic acid or the like.

The monomer containing phosphoric acid group illustratively includes mono(2-(meth)acryloyloxyethyl) acid phosphate or the like.

The monomer (2) may be used singly or in a mixture of two or more monomers according to the purpose. A content of the monomer (2) in the crosslinked particulate copolymer can be 0.1–30 mol %, preferably 0.5 –20 mol %. If the content of the ingredient (2) is below 0.1 mol %, the water developability of the resulting photosensitive resin composition would be poor. If it exceeds 30 mol %, the resulting composition would be very hard but fragile.

The monomer (3) which constitutes the copolymer (A) is a monomer containing two or more addition-polymerizable groups except for the aliphatic conjugated diene monomer (1). The presence of this monomer induces three-dimensional cross-linkage in the resulting copolymer. Illustrative examples of the monomers (3) are (meth)acrylates of polyols, such as ethylene glycol di(meth)acrylate, trimethylolpropane di(meth)acrylate, trimethylolpropane tri(meth) acrylate, propyleneglycol dimethacrylate, propyleneglycol diacrylate, divinylbenzene, trivinylbenzene, pentaerythritol tri(meth)acrylate, pentaerythritol tetra(meth)acrylate, 1,4-butanediol di(meth)acrylate, 1,6-hexanediol di(meth) acrylate or the like. The monomers (3) may be used singly or in a mixture of two or more monomers.

A content of the monomer (3) can be 0.1–20 mol %, preferably 0.5–10 mol %. If the content of the monomer (3) is below 0.1 mol %, the water developability of the composition would be lowered. If it exceeds 20 mol %, the compatibility between the particulate polymer and the photopolymerizable monomer would be worse and deteriorate the operability. Further, the strength of the polymer composition after photocuring would markedly lower.

The monomer (4) which constitutes the copolymer (A) can be any compound having one or more addition-polymerizable groups except for the monomers (1)–(3). Illustrative examples of the monomers (4) are α-methyl styrene; vinyl toluene; acrylonitrile, vinyl chloride, vinylidene chloride, (meth)acrylamide, methyl (meth) acrylate, ethyl (meth)acrylate, n-propyl (meth)acrylate, 2-ethylhexyl (meth)acrylate; unsaturated (mono)carboxylic acids, such as (meth)acrylic acid, crotonic acid, cinnamic acid or the like: unsaturated polycarboxylic acids (anhydrides), such as maleic acid (anhydride), fumaric aid, itaconic acid (anhydride), citraconic acid, mesaconic acid or the like; esters containing free carylboxyl group, such as monomethyl ester, monoethyl ester, monopropyl ester, monohexyl ester, monooctyl ester, dimethyl ester, diethyl ester, dipropyl ester, dibutyl ester, etc. of the unsaturated polycarboxylic acids; nitriles containing free carboxyl group of mononitriles of the unsaturated polycarboxylic acids, nitriles containing non-polymerizable polycarboxyl group, such as phthalic acid, succinic acid, adipic acid or the like; and esters containing free carboxyl groups, such as monoesters of non-polymerizable polycarboxylic acids (e.g. phthalic acid, succinic acid, adipic acid, etc.) and unsaturated carboxylic acids containing hydroxy group (e.g. allyl alcohol, 2-hydroxyethyl (meth)acrylate, etc.).

The copolymers (A) can be prepared as particulate copolymer according to emulsion polymerization or suspension polymerization using radical initiator. The emulsion polymerization is preferred in view of size of particles and the uniformity of the particle size. The whole reactants of the polymerization, such as monomers, radical initiators or the like may be added from the beginning of the reaction, or optionally in divisions after starting the reaction. The polymerization may be carried out at 0°–80° C. within a reactor in which oxygen has been removed, but the operating conditions such as temperature or stirring may be optionally changed on the way of the reaction. The polymerization system may be carried out continuously or batchwise.

The radical initiators illustratively include organic peroxides such as benzoyl peroxide, cumene hydroperoxide, paramenthane hydroperoxide or lauroyl peroxide; diazo compounds such as azobisisobutyronitrile or the like; inorganic compounds such as potassium persulfate or the like; redox catalysts such as a combination of organic compound-ferric sulfate; or the like.

The thermoplastic block copolymer (B) mainly consists of a hard segment and a soft segment, and is characterized by that the hard segment is a thermoplastic non-elastomer copolymer block having a glass transition temperature of 20° C. or more and that the soft segment is a elastomer copolymer block having a glass transition temperature of 10° C. or less.

The hard segment which constitutes the block copolymer (B) is characteristic of a thermoplastic non-elastomer copolymer block having a glass transition temperature of 20° C. or more. Preferable examples of the monomer for the hard segment are vinyl aromatic compounds. Illustrative examples thereof are styrene, t-butylstyrene, α-methylstyrene, p-methylstyrene, divinylbenzene, 1,1-diphenylstyrene, N,N-dimethyl-p-aminoethylstyrene, N,N-diethyl-p-aminoethylstyrene, vinylpyridine and the like.

Preferred are styrene and α-methylstyrene. If necessary, the hard segment can be a copolymer of the above mentioned vinyl aromatic compound with another copolymerizable monomer including a conjugated diene monomer which will be exemplified later, as long as the hard segment has a glass transition temperature of 20° C. or more.

The soft segment which constitutes the block copolymer (B) is characteristic of an elastomer polymer block having a glass transition temperature of 10° C. or less. Preferable examples of the monomers which mainly constitutes the soft segment are conjugated diene compounds, such as 1,3-butadiene, isoprene, 2,3-dimethyl-1,3-butadiene, 1,3-pentadiene, 2-methyl-1,3-pentadiene, 1,3-hexadiene, 4,5-diethyl-1,3-octadiene, 3butyl-1,3-octadiene, chloroprene and the like. In order to obtain good properties, preferred are 1,3-butadiene, isoprene and 1,3-pentadiene and more preferred are 1,3-butadiene and isoprene. The soft segment can also be a copolymer of the above mentioned conjugated diene compound with another monomer (e.g. the above mentioned vinyl aromatic compound), as long as the soft segment has a glass transition temperature of 10° C. or less.

The basic nitrogen atom-containing compound (C) preferably is a compound containing both a tertiary basic nitrogen atom and vinyl group. The basic nitrogen atom-containing compound (C) may preferably have the following formula (I) or (II):

[with the proviso that n=1, 2, or 3, X is

R is H or CH$_3$] and

[with the proviso that Y is H,

R is H or CH$_3$: in case of R'=CH$_3$, n is 1–6, and in case of R'=C$_2$H$_5$, n is 2–6

Preferable compounds are those of the formula (I) or (II) except for the case of Y=H in the formula (II). Typical examples of the compounds (I) and (II) are N,N-dimethylaminoethyl (meth)acrylate, N,N-dimethylaminopropyl(meth)acrylamide, N,N-dimethylaminoethyl-N'-(meth)acryloyl carbamate, N,N-diethylaminoethoxyethyl (meth)acrylate and the like. Preferred are N, N-dimethylaminoethoxyethanol and N,N-diethylaminoethoxyethanol. These compounds may be used as a mixture.

Other amines which do not have polymerizing ability can be used in combination with the above compound (I) or (II). Examples of the other amines are 2-N-morpholinoethanol and 2-piperidinoethanol. The other amines also include monoamine, diamine and triamine compounds having a boiling point of 50° C. or more.

The photopolymerizable unsaturated monomer (D) can be ethylenic unsaturated monomers. The photopolymerizable ethylenic unsaturated monomer imparts water resistance to the printing plates, but does not inhibit water developability of the printing plates. The monomers (D), as mentioned above, can be ethylenic unsaturated monomers, especially polyfunctional ethylenic unsaturated monomers. Examples of the monomers are the monomers as explained in the preparation of core/shell three-dimensional crosslinked polymer particles (A) and polyfunctional monomers showing favorable compatibility with the resin system (e.g. those listed below or those described in U.S. Pat. No. 3,801,328).

Typical examples of the monomers (D) are unsaturated carboxylic acid esters (e.g. n-butyl (meth)acrylate, 2-ethylhexyl (meth)acrylate, lauryl (meth)acrylate, stearyl (meth)acrylate, polyethylene glycol mono(meth)acrylate, methoxypolyethylene glycol mono(meth)acrylate, polypropylene glycol (meth)acrylate, phenoxypolyethylene glycol mono(meth)acrylate, ethylene glycol di(meth)acrylate, diethylene glycol di(meth)acrylate, triethylene glycol di(meth)acrylate, polyethylene glycol di(meth)acrylate, methoxypolyethylene glycol di(meth)acrylate, polypropylene di(meth)acrylate, diallyl itaconate, glycerol di(meth)acrylate, glycerol tri(meth)acrylate, 1,3-propyleneglycol di(meth)acrylate, 1,4-cyclohexanediol di(meth)acrylate, 1,2,4-butanetriol tri(meth)acrylate, glycerol polypropyleneglycol tri(meth)acrylate, 1,4-benzenediol di(meth)acrylate, pentaerythritol tetra(meth)acrylate, tetramethyleneglycol di(meth)acrylate, 1,5-pentanediol di(meth)acrylate, 1,6-hexanediol di(meth)acrylamide, etc.), unsaturated amides, such as methylene bis(meth)acrylamide, ethylene bis(meth)acrylamide, 1,6-hexamethylene bis(meth)acrylamide, diethylenetriamine tris(meth)acrylamide, N(hydroxymethyl) acrylamide, N-(hydroxymethyl)methacrylamide, N-(β-hydroxymethyl) acrylamide, n-(β-hydroxymethyl) methacrylamide, N,N-bis (β-hydroxyethyl)methacrylamide, etc.), divinyl esters (e.g. divinyl adipate, divinyl phthalate, etc.), acrylated or methacrylated urethanes (those are derived, for example, from the reaction of hydroxyalkyl acrylate or hydroxyalkyl methacrylate with isocyanate compound), diacrylate or dimethacrylate, ethers from aromatic compounds and polyalcohols (e.g. diepoxypolyether derived from bisphenol and novolak compound), polyester mono/di(meth)acrylate, polyester mono/di(meth)acrylate and the like. One or more of these compounds may be used, and in general water-soluble or water-dispersible monomers are preferred.

The photopolymerizable initiators (E) is used for initiating polymerization when exposed to light. Typical examples are benzoin ethers (e.g. benzoin isopropyl ether, benzoin isobutyl ether), benzophenones (e.g., benzophenone, methyl-o-benzoin benzoate, 4,440 -bis(dimethylamino) benzophenone), xanthones (e.g. xanthone, thioxanthone, 2-chlorothioxanthone), acetophenones (e.g. acetophenone, trichloroacetophenone, 2,2-diethoxyacetophenone, 2,2-dimethoxy-2-phenylacetophenone), benzil, 2-ethylanthraquinone, methylbenzoyl formate, 2-hydroxy-2-methylpropiophenone, 2-hydroxy-2-methyl-4'-isopropyl-isopropiophenone, 1-hydroxycyclohexyl phenyl ketone, and the like. These compounds may be used singly or in combination.

Preferably, the photosensitive compositions may contain a hydrophilic polymer which has hydrophilic functional group in the molecule and a molecular weight of 1,000–1,000,000, if necessary. The hydrophilic polymers may be prepared, for example, by introducing hydrophilic functional groups (e.g. carboxyl group, sulfonic acid group, amino group, etc.) into suitable polymer backbones (e.g. polymers of conjugated diene hydrocarbons, copolymers of conjugated diene hydrocarbons with monoolefinic unsaturated compounds, or polymers free of conjugated diene hydrocarbons, etc.) for denaturing with carboxylic acids, sulfonic acids and amines. The hydrophilicity of polymers can be represented by acid value or amine value of polymers, and preferred values thereof are 2–200, in particular preferably 20–80. If it is below the range, water developability would be insufficient. If it exceeds the range, no sufficient physical image quality would be obtained.

Examples of the polymer backbones for introducing the hydrophilic group are butadiene polymer, isoprene polymer, chloroprene polymer, styrene-butadiene copolymer, styrene-isoprene copolymer, styrene-chloroprene copolymer, acrylonitrile-butadiene copolymer, acrylonitrile-isoprene copolymer, acrylonitrile-chloroprene copolymer, methyl methacrylate-butadiene copolymer, methyl methacrylate-isoprene copolymer, methyl methacrylate-chloroprene copolymer, methyl acrylate-butadiene copolymer, methyl acrylate-isoprene copolymer, methyl acrylate-chloroprene copolymer, acrylonitrile-butadiene-styrene copolymer, acrylonitrile-isoprene-styrene copolymer, acrylonitrile-chloroprene-styrene copolymer, diblock copolymer (e.g. polystyrene-polyisoprene, polystyrene-polybutadiene, polyisoprene-polybutadiene, etc.), block copolymer (e.g. polystyrene-polybutadiene-polystyrene, polystyrene-polyisoprene-polystyrene, polystyrene-polyethylene/ butylene-polystyrene, etc.), epichlorohydrin polymer, epichlorohydrin-ethylene oxide copolymer, epichlorohydrin-propylene oxide copolymer, and polymer free of conjugated diene hydrocarbons (e.g. epichlorohydrin rubber as copolymer thereof with allyl glycidyl ether, polyethylene chloride, vinyl chloride copolymer, vinylidene chloride, polypropylene chloride, ethylene chloride-propylene gum, etc.). During the preparation of these polymer, acidic or basic monomers can be directly introduced into the polymerization system.

A concrete example of the hydrophilic polymer may be a maleic acid half ester-modified hydrophilic polymer prepared by reacting the appropriate polymer or copolymer with maleic acid and then reacting with alcohols or α, β-ethylenic unsaturated monomer having hydroxy group. Since the use of the α, β-ethylenic unsaturated monomer having hydroxy group imparts photopolymerizability to the hydrophilic polymer, mechanical properties of a coated film can be improved. Preferred alcohols include methanol, ethanol, butanol, propanol, lauryl alcohol and the like. The α, β-ethylenic unsaturated monomers having hydroxy group illustratively include 2-hydroxyethyl acrylate, hydroxypropyl acrylate, 2-hydroxyethyl methacrylate, hydroxypropyl methacrylate, hydroxybutyl acrylate, hydroxybutyl methacrylate, allyl alcohol, methallyl alcohol, N-(4-hydroxyphenyl)acrylamide, N-(4-hydroxyphenyl) methacrylamide, o-, m-, p-hydroxystyrene, o-, m-, p-hydroxyphenyl acrylate or methacrylate and the like. Preferable are 2-hydroxyethyl (meth)acrylate and hydroxypropyl (meth)acrylate.

Examples of other hydrophilic polymer are an amine-modified material of an appropriate diene (co)polymer, for example, a cationic polybutadiene obtained by treating polybutadiene with a peracid such as peracetic acid or the like to introduce an oxiran group into 1,2-vinyl group, and then treating with an amine to open the oxiran ring followed by neutralizing the amino group. The modifying method is applied for modifying electrocoating resins.

Examples of other hydrophilic polymer are a hydrophilic polymer obtained by treating polymer free of an appropriate conjugated diene hydrocarbon with carboxylic acid, sulfonic acid, or amine; a polyurethane containing carboxyl group; a polyurea-urethane containing carboxyl group; a polyester containing carboxyl group; a polyamide containing carboxyl group; a sodium polyacrylate and the like. Also, polyacrylamide, polyvinyl alcohol, carboxymethyl cellulose, hydroxyethyl cellulose, methyl cellulose, polyethylene oxide, polypropylene oxide, polytetramethylene glycol, polyethyleneimine or the like may be used solely or in combination with them. Preferred hydrophilic polymers are hydrophilic polymers obtained by treating a conjugated diene hydrocarbon polymer and a copolymer of a conjugated diene hydrocarbon and a monoolefinic unsaturated compound with maleic acid and then modifying with alcohols and/or α, β-ethylenic unsaturated monomers.

Preferred conjugated diene hydrocarbon polymers employed in the above treatments include butadiene polymers, isoprene polymers, styrene-butadiene polymers, styrene-isoprene polymers, polystyrenepolybutadiene block copolymers, polystyrene-polyisoprene block copolymers, polystyrene-polyisoprene-polystyrene triblock copolymers.

The photosensitive resin composition of the present invention may further contain thermal addition-polymerization inhibitor, antioxidant, ozonization inhibitor, plasticizer and the like.

The photosensitive resin composition of the present invention should have an adhesive strength to hydroxyalkyl methyl cellulose used for the slip layer of at least 30 g/50 mm, preferably at least 50 g/50 mm. If the adhesive strength of the photosensitive resin composition to hydroxyalkyl methyl cellulose is below 30 g/50 mm, unfavorable adhesion to the cover film would occur when extruding the photosensitive resin composition onto the cover film and pressing them. Also, unfavorable transcription of the slip layer to the photosensitive resin composition layer would occur during peeling the cover film.

The photosensitive layer resin composition for the flexographic printing plate can prepared by sufficiently mixing (A) the hydrophilic crosslinked particulate copolymer, (B) the thermoplastic block copolymer, (C) the compound containing a basic nitrogen atom, (D) the photopolymerizable unsaturated monomer and (E) the photopolymerization initiator together with various optional additives with heating, using, for example, a kneader, an intermixer or the like. The properties of the resultant compositions can be freely controlled from wax or rubber form showing fluidity to low viscous liquid form showing fluidity, and the degree of the fluidity can be appropriately selected according to the purpose of using the composition. In particular, an appropriate amount of some solvent may be added to the composition when a low viscosity of composition is desired.

The slip layer of the present invention is fundamentally made of hydroxyalkyl methyl cellulose. The hydroxyalkyl methyl cellulose is almost insoluble in solvents except water and is applied on the cover film in the form of aqueous solution. In order to improve drying ability of the hydroxyalkyl methyl cellulose solution, an organic solvent, such as ethyl alcohol, isopropyl alcohol or the like can be added, although pinholes, unevenness, crater and the like of the coated film would likely occur and it is difficult to obtain a coated film with good appearance.

However, the present inventors have found that a coated film of hydroxyalkyl methyl cellulose having good appearance can be obtained by adding 0.005–0.2% by weight, preferably 0.01–0.1% by weight of a surfactant to an aqueous solution of the hydroxyalkyl methyl cellulose, preferably containing 0.5–10% by weight of the hydroxyalkyl methyl cellulose or a mixture thereof with an organic solvent (e.g. methanol, ethanol, isopropyl alcohol, methyl ethyl ketone, etc.). If the amount of the surfactant is below 0.005% by weight, drying ability would not be improved. If it is more than 0.2% by weight, the technical effect obtained by the addition of the surfactant would lower and suitable balance between adhesion-peeling strength of the cover film and the photosensitive resin composition would be deteriorated.

Examples of the surfactants are cationic surfactants, for example primary—tertiary aliphatic amine salts (8–18 carbon atoms), amine salts such as amido-bond amine, ester-bonds amine, ether-bond amine or the like, quaternary ammonium salts, etc.; anionic surfactants, for example perfluoroalkylcarboxylic acid sodium salts, perfluoroalkylcarboxylic acid potassium salt, alkylbenzenesulfonic acid salt, alkylnaphthalenesulfonic acid salt, etc.; nonionic surfactants, for example perfluoroalkyl alkylate, polyoxyethylene alkyl ether, etc.; silicon surfactants; acetylene glycol surfactants, and the like.

If necessary, the slip layer may contain dyestuffs, pigments, photoreactive materials or the like. For improving image quality, special dyestuffs such as photocoloring dyestuffs or photofading dyestuffs may be added, and for the purpose of improving hardening property, photoinitiators, initiation aids or the like may be also added.

The slip layer preferably has a thickness of at least 2.5 g/m$^2$ when calculated in terms of coated amount. If the amount is less than 2.5 g/m$^2$, image quality would lower at the beginning and with time thereafter.

The cover film used in the present invention is one which is well known as a silica-containing matted film. The silica-containing matted film may preferably have a film surface roughness (Ra) of 0.01–1.0 μm (average roughness around a centerline) and is a polyester film containing 0.005 to 5% by weight of silica particles having an average particle size of 0.05 to 10 μm in polyester. If Ra on the surface of film is below 0.01 μm or exceeds 10 μm, image quality would be lowered. If the silica particles have an average particle size of below 0.05 μm or exceeding 10 μm, the preferred range of Ra would hardly be obtained. Further, if the content silica particles is below 0.005% by weight or exceeds 5% by weight, the suitable balance of adhesion-peeling strength with hydroxyalkyl methyl cellulose is not possibly obtained.

The flexographic printing plate having the slip layer thus prepared can be exposed to chemically active light such as ultraviolet light or the like via negative film having a desired pattern, and the unexposed part is washed with water, removed and dried to give a distinct relief image. If necessary, the flexographic printing plate which has been once exposed may be reexposed after drying.

EXAMPLES

The present invention will be explained by the following Examples which, however, are not construed as limiting the present invention to their details.

(Example 1 and Comparative Example 1)

Measurement of Balance between Adhesion-Peeling Strength

A. Preparation of an aqueous solution for a slip layer

Five aqueous solutions for the slip layer were obtained and each solution contained a different component selected from hydroxypropyl methyl cellulose, hydroxyethyl methyl cellulose, hydroxypropyl cellulose, polyethylene oxide and polyvinyl alcohol.

In case of hydroxypropyl methyl cellulose, hydroxyethyl methyl cellulose and hydroxypropyl cellulose, 6 kg of water (60°–80° C.) and 0.6 kg of powder of each component were mixed with stirring. After stirring for 3 minutes, 3.4 kg of water (below 25° C.) was added to the mixture, which was stirred for about 1 hour to give an aqueous solution having a solid content of 6 wt %.

In case of polyethylene oxide and polyvinyl alcohol, 9.4 kg of water and 0.6 kg of powder of each component were mixed with stirring, and the resultant mixture was stirred for about 2 hours to obtain an aqueous solution having a solid content of 6 wt %.

B. Application of the aqueous solution for the slip layer

The aqueous solution prepared in A was applied onto each film listed below using a bar coater #30: silica-containing matted film (Manufactured by Teijin Co., Ltd., an average particle size of 0.96 μm, 1.5% by weight based on the polymer weight, Ra 0.23 μm, thickness 100 μm); Sandblast Matted film (PS-100 manufactured by Teijin Co., Ltd., Ra 0.52 μm, thickness 100 μm); Chemical Etching Matted film (Manufactured by Toyo Cross Co., Ltd., Ra 0.36 μm, thickness 85 μm); Coating Matted film (Manufactured by Somar Co., Ltd., Ra 0.37 μm, thickness 100 μm). The coated film was allowed to stand still for 5 minutes and dried at 90° C. in a drier for 5 minutes to obtain a cover film having the slip layer.

C. Pressing to a photosensitive resin composition and measurement of balance between adhesion and peeling strength:

The ingredients of the photosensitive resin composition used in the experiment are shown below.

| Photosensitive Resin Composition (A) | |
|---|---|
| Ingredient | Part by weight (% by weight) |
| Butadiene/Methacrylic acid/Methyl methacrylate/divinylbenzene copolymer | 40.0 |
| Styrene/Isoprene block copolymer | 24.0 |
| Liquid isoprene rubber | 5.0 |
| Dimethylaminopropyl methacrylamide | 7.0 |
| Lauryl methacrylate | 12.0 |
| 1,6-Hexanediol dimethacrylate | 11.1 |
| Benzoin isopropyl ether | 0.3 |
| 2,6-Di-t-butyl-p-cresol | 0.6 |

On the surface of the photosensitive resin composition having 2.70 mm thickness prepared in the composition above was pressed the film obtained in B with a handroller while facing the slip layer toward the surface of the photosensitive resin composition, and a chip of 50 mm wide and 20 cm long was cut off. On this sample, the peeling strength of the cover film during transcribing the slip layer from the cover film to the photosensitive resin composition was measured with Autograph (AGS-100A manufactured by Shimadzu Co., Ltd.) under the condition of peeling at 180°. Table 1 shows the result measured.

TABLE 1

| Film | Slip Material | Adhesion-peeling strength Balance (g/50 mm) and evaluation thereof |
|---|---|---|
| Silica-containing matted film (Ra 0.23 μm) (Thickness 100 μm) | Hydroxypropyl methyl cellulose (Note 1) | 6–12 (Good) |
| | Hydroxyethyl methyl cellulose (Note 2) | 6–8 (Good) |
| | Hydroxypropyl cellulose (Note 3) | 22–25 (Bad) |
| | Polyethylene oxide (Note 4) | 6–14 (Good) |

TABLE 1-continued

| Film | Slip Material | Adhesion-peeling strength Balance (g/50 mm) and evaluation thereof |
|---|---|---|
| | Polyvinyl alcohol (Note 5) | 6–14 (Good) |
| Chemical Etching matted film | Hydroxypropyl methyl cellulose | Not transcribed |
| (Ra 0.36 μm) | Polyethylene oxide | Not transcribed |
| (Thickness 85 μm) | Polyvinyl alcohol | Not transcribed |
| Sandblast matted film | Hydroxypropyl methyl cellulose | Not transcribed |
| Matted film | Polyvinyl alcohol | Not transcribed |
| (Ra 0.52 μm) | | |
| (Thickness 100 μm) | | |
| Coating matted film | Hydroxypropyl methyl cellulose | Not transcribed |
| (Ra 0.37 μm) | | |
| (Thickness 100 μm) | | |

(Note 1): Metrose 65SH50 manufactured by Shin-Etsu Chemical Co., Ltd.
(Note 2): Metrose SEB-04T manufactured by Shin-Etsu Chemical Co., Ltd.
(Note 3): Metrose LE-G manufactured by Shin-Etsu Chemical Co., Ltd.
(Note 4): POLYOX WSR N-750 manufactured by Union Carbide Co.
(Note 5): NK-05 manufactured by Nippon Synthetic Rubber Co., Ltd.

Evaluation of the adhesion-peeling strength:

Good: Adhesion-peeling strength balance is 5 to 15 g/50 mm.

Bad : Adhesion-peeling strength balance is more than 15 g/50 mm.

As shown from the above result, the film having suitable balance between adhesion-peeling strength without a special peeling treatment was only the silica-containing matted film.

(Example 2 and Comparative Example 2)

Evaluation of the quality image

A. Preparation of the slip layer aqueous solution:

The aqueous solution was prepared in the same manner as in Example 1, A.

B. Application of the slip layer aqueous solution:

The slip layer aqueous solution prepared in A was applied onto a silica-containing matted film (Manufactured by Teijin Co., Ltd., an average particle diameter of 0.96 μm, 1.5% by weight based on the weight of the polymer, Ra 0.23 μm, thickness 100 μm), using a bar coater #12, 30, 45, 60 (to be suitable for dry weight), and the film was allowed to stand still for 5 minutes and dried at 90° C. in a drier for 5 minutes to give a slip film.

C. Preparation of the samples:

The compositions of the photosensitive resin composition used in this Example were those (B) and (C) as shown below. The slip film obtained in B was pressed on the surface of the photosensitive resin composition having 2.70 mm of thickness with a handroller to obtain a sample.

| Ingredient | Part by weight (% by weight) |
|---|---|
| Photosensitive resin composition (B) | |
| Butadiene/Methacrylic acid/Methyl methacrylate/ divinylbenzene copolymer | 35.0 |
| Styrene/Isoprene block copolymer | 20.0 |
| Liquid isoprene rubber | 5.0 |
| Dimethylaminopropylmethacrylamide | 15.0 |
| Lauryl methacrylate | 15.0 |
| 1,6-Hexanediol dimethacrylate | 9.0 |
| Benzil | 0.4 |
| 2,6-Di-t-butyl-p-cresol | 0.6 |

| Ingredient | Part by weight (% by weight) |
|---|---|
| Photosensitive resin composition (C) | |
| Butadiene/Methacrylic acid/Methyl methacrylate/ Divinylbenzene copolymer | 35.0 |
| Styrene/Isoprene block copolymer | 24.0 |
| Liquid isoprene rubber | 5.0 |
| Dimethylaminorpopylmethacrylamide | 9.0 |
| Lauryl methacrylate | 12.0 |
| 1,6-Hexanediol dimethacrylate | 14.0 |
| 2-Ethylanthraquinone | 0.4 |
| 2,6-Di-t-butyl-p-cresol | 0.6 |

D. Plate making and evaluation of image:

The sample obtained in C was at first exposed from back for 110 seconds and exposed for 14 minutes on Flexeed® plate making apparatus FB-1 through the negative film (20×30 cm) showing 1201 pi 60% net point. Then it was treated with 0.5% aqueous solution of surfactant (40° C.) for 4 minutes, using a washing machine (JOW-$A_2$-PD manufactured by Nippon Denshi Seiki), dried at 80° C. for 10 minutes, and finally exposed for 5 minutes on the FB-1. The end of the net point part in the resulting plate and the depth of the net point were measured with a microscope.

The result of measurement was shown in Tables 2 and 3.

TABLE 2

| | Photosensitive Resin Composition (B) | | | | |
|---|---|---|---|---|---|
| | Dry | 120L60% Net point depth (μm) | | | |
| | weight | Initial value | | One month later | |
| Material of the slip layer | (g/m$^2$) | End | Center | End | Center |
| Hydroxypropyl methyl cellulose (Note 1) | 1.6 | 40 | 9 | 34 | 8 |
| | 2.5 | 32 | 21 | 33 | 22 |
| | 3.0 | 43 | 33 | 41 | 30 |
| | 4.5 | 38 | 32 | 43 | 30 |
| Hydroxyethyl methyl cellulose (Note 2) | 1.5 | 35 | 15 | 40 | 19 |
| | 2.5 | 42 | 30 | 39 | 23 |
| Polyethylene oxide (Note 3) | 1.6 | 8 | 4 | — | — |

TABLE 2-continued

Photosensitive Resin Composition (B)

| Material of the slip layer | Dry weight (g/m²) | 120L60% Net point depth (μm) | | | |
|---|---|---|---|---|---|
| | | Initial value | | One month later | |
| | | End | Center | End | Center |
| (Note 4) | 1.6 | 9 | 6 | — | — |
| Polyvinyl alcohol | 1.5 | 13 | 12 | — | — |
| (Note 5) | 3.3 | 13 | 10 | — | — |
| (Note 6) | 1.5 | 9 | 6 | — | — |
| Hydroxypropyl cellulose | 1.6 | 8 | 5 | — | — |
| (Note 7) | 4.1 | 10 | 9 | — | — |

(Note 1): Metrose 65SH50 manufactured by Shin-Etsu Chemical Co., Ltd.
(Note 2): Metrose SEB-04T manufactured by Shin-Etsu Chemical Co., Ltd.
(Note 3): POLYOX WSR N-750 m manufactured by Union Carbide Co.
(Note 4): POLYOX WSR N-80 manufactured by Union Carbide Co.
(Note 5): NK-05 manufactured by Nippon Synthetic Rubber Co., Ltd.
(Note 6): GL-05 manufactured by Nippon Synthetic Rubber Co., Ltd.
(Note 7): Metrose LE-G manufactured by Shin-Etsu Chemical Co., Ltd.

TABLE 3

Photosensitive Resin Composition (C)

| Material of the slip layer | Dry weight (g/m²) | 120L60% Net point depth (μm) | | | |
|---|---|---|---|---|---|
| | | Initial value | | One month later | |
| | | End | Center | End | Center |
| Hydroxypropyl methyl cellulose (Note 1) | 1.6 | 38 | 10 | 32 | 7 |
| | 2.5 | 30 | 22 | 30 | 20 |
| | 3.0 | 40 | 32 | 40 | 30 |
| | 4.5 | 38 | 30 | 40 | 32 |
| Hydroxyethyl methyl cellulose | 1.5 | 37 | 17 | 37 | 13 |
| (Note 2) | 2.5 | 40 | 25 | 39 | 24 |
| Polyethylene oxide | | | | | |
| (Note 3) | 1.6 | 9 | 7 | — | — |
| (Note 4) | 1.6 | 8 | 4 | — | — |
| Polyvinyl alcohol | 1.5 | 15 | 16 | — | — |
| (Note 5) | 3.3 | 13 | 10 | — | — |
| (Note 6) | 1.5 | 8 | 7 | — | — |
| Hydroxypropyl cellulose | 1.6 | 8 | 7 | — | — |
| (Note 7) | 4.1 | 7 | 10 | — | — |

(Note 1): Metrose 65SH50 manufactured by Shin-Etsu Chemical Co., Ltd.
(Note 2): Metrose SEB-04T manufactured by Shin-Etsu Chemical Co., Ltd.
(Note 3): POLYOX WSR N-750 manufactured by Union Carbide Co.
(Note 4): POLYOX WER N-80 manufactured by Union Carbide Co.
(Note 5): NK-05 manufactured by Nipon Synthetic Rubber Co., Ltd.
(Note 6): GL-05 manufactured by Nippon Synthetic Rubber Co., Ltd.
(Note 7): Metrose LE-G manufactured by Shin-Etsu Chemical Co., Ltd.

It was clear from the above result that the net point depth of the central part showing 20 μm or more at initial time and one month later was observed only in the case of using hydroxyalkyl methyl cellulose as material of the slip layer with dry weight 2.5 g/m² or more.

(Example 3 and Comparative Example 3)

Evaluation of the adhesive strength of the resin composition

Adhesive strength of the following photosensitive resin compositions having different compositions with hydroxypropyl methyl cellulose was measured.

| Ingredient | Part by weight (% by weight) |
|---|---|
| Photosensitive resin composition (D) | |
| Butadiene/Methacrylic acid/Methyl methacrylate/divinylbenzene copolymer | 50.0 |
| Styrene/isoprene block copolymer | 10.0 |
| Liquid isoprene rubber | 4.1 |
| Dimethylaminopropylmethacrylamide | 15.0 |
| Lauryl methacrylate | 9.0 |
| 1,6-Hexanediol diacrylate | 11.0 |
| 2,2-Dimethox-2-phenylacetophenone | 0.3 |
| 2,6-Di-t-butyl-p-cresol | 0.6 |
| Photosensitive resin composition (E) | |
| Butadiene/Methacrylic acid/Methyl methacrylate/divinylbenzene copolymer | 40.0 |
| Styrene/Isoprene block copolymer | 31.0 |
| Dimethylaminopropylmethacrylamide | 7.0 |
| Lauryl methacrylate | 10.0 |
| 1,6-Hexanediol diacrylate | 10.0 |
| Oleinamide | 1.1 |
| 2,2-Dimethoxy-2-phenylacetophenone | 0.3 |
| 2,6-Di-t-butyl-p-cresol | 0.6 |
| Photosensitive resin composition (F) | |
| Butadiene/Methacrylic acid/Methyl methacrylate/divinylbenzene copolymer | 40.0 |
| Styrene/Isoprene block copolymer | 32.0 |
| Dimethylaminopropylmethacrylamide | 7.0 |
| Lauryl methacrylate | 10.1 |
| 1,6-Hexanediol dimethacrylate | 10.0 |
| 2,2-Dimethoxy-2-phenylacetophenone | 0.3 |
| 2,6-Di-t-butyl-p-cresol | 0.6 |

A. Preparation of the aqueous solution for the slip layer:

It was prepared using hydroxypropyl methyl cellulose in the same manner as in Example 1, A above.

B. Application of the aqueous solution for the slip layer:

The aqueous solution obtained in A above was applied onto the polyethylene terephthalate film (T-100 manufactured by Diafoil, 100 μm) in the same manner as in Example 1, B, and then dried to obtain a slip film.

C. Transcription of the slip layer and measurement of the adhesive strength:

On the coating surface of the slip film obtained in B above was pressed 50 mm wide Cello-Tape (Nichiban #405) so as to avoid the air introduction, and the tape was peeled as the slip layer to give 50 mm wide hydroxypropyl methyl cellulose coating film. The coating film was pressed on the surface of each photosensitive resin composition (2.70 mm thick) (A)–(C) with a handroller, and the peeling strength was measured on Autograph (AGS-100A manufactured by Shimadzu) under peeling conditions of 180°, whereby the adhesive strength between each resin composition and hydroxypropyl methyl cellulose was measured.

D. Measurement of adhesive strength between the cover film and the slip layer

The slip film obtained in the above (B) was cut to 100 mm×200 mm on which an adhesive tape having 50 mm width (available from Nichiban Co., Ltd. as Nichiban #405) was pressed from the slip film coated surface so that air was not trapped therebetween. A peeling strength of the tape was measured by an autograph (available from Shimadzu Co., Ltd. as AGS-100A) in which the adhesive tape was peeled off at an angle of 180°.

| | |
|---|---|
| Adhesive strength between hydroxypropyl methyl cellulose and the cover film | 15–20 (g/50 mm) |

E. Practical evaluation

The aqueous solution obtained in A was applied on a silica-containing matted film (average particle size of silica of 0.96 μm, 1.5% by weight based on the weight of the polymer, Ra 0.23 μm, 100 μm thick) and dried in the same manner as in B above to give a slip film. The slip film was pressed onto each photosensitive resin composition (D)–(F) in the same manner as in Example 1°C., whereby the transcription property of the cover film was evaluated.

The result of measurement was shown in Table 4.

TABLE 4

| Photosensitive resin composition | Adhesive strength of hydroxypropyl methyl cellulose with the resin composition (g/50 mm) | Evaluation of transcription |
|---|---|---|
| (D) | 225–300 | Good |
| (E) | 50–80 | Good |
| (F) | 25–35 | Poor |

(Note 1): There are partial spots wherein no transcription occurred.

It was clear from the result above that, when a combination of silica-containing matted film and hydroxypropyl methyl cellulose was used as a slip film, the adhesive strength of the photosensitive resin composition used with hydroxypropyl methyl cellulose should be 30 g/50 mm or more, preferably 50 g/50 mm or more. In addition, it was clear that the adhesive strength between the hydroxypropyl methyl cellulose and the photosensitive resin composition was higher than that between the hydroxypropyl metyl cellulose and the cover film by at least 20 g/50 mm, preferably 30 g/50 mm.

Example 4 and Comparative Example 4

A. Preparation of the slip layer aqueous solution:

To 6 kg of water (70°–80° C.) was added 0.6 kg of hydroxypropyl methyl cellulose powder with stirring, and the mixture was stirred for 3 minutes, mixed with 3.4 kg of water (below 25° C.) and stirred for 30 minutes. After the liquid temperature lowered up to about 30° C., the mixture was mixed with 5 kg of isopropyl alcohol and stirred for 30 minutes. Then, each % by weight of the surfactant shown in Table 5 was added to give an aqueous solution. The resultant aqueous solution contained 6% of solid content.

B. Application of the slip layer aqueous solution:

The slip layer aqueous solution prepared in A above was applied onto the silica-containing matted film (average particle diameter of silica particle being 0.96 μm, 1.5% by weight based on the weight of the polymer, Ra 0.23 μm, 100 μm thick) with a bar coater #60, dried with a drier for 1 minute and dried at 90° C. in a drying machine for 5 minutes to give a slip film. Dry coated amount was bout 3.0 g/m².

C. Evaluation of Appearance:

The slip film obtained in B above was dipped in 0.2% solution of crystal violet in methanol for 1–2 seconds and dried to dye the slip layer. The surface of the blue slip layer obtained was observed with eyes, and existence of sides, blurs, coating strips and coating crawings was evaluation.

D. Pressing of the photosensitive resin composition and measurement of the balance between adhesion-peeling strength The ingredients of the photosensitive resin composition (G) used in this Example was shown below.

| Photosensitive resin composition (G) | |
|---|---|
| Ingredient | Part by weight (% by weight) |
| Butadiene/Methacrylic acid/Methyl methacrylate/divinyl benzene copolymer | 40.0 |
| Styrene/Isoprene block copolymer | 25.0 |
| Liquid isoprene rubber | 5.0 |
| Dimethylaminopropylmethacrylamide | 7.0 |
| Lauryl methacrylate | 11.0 |
| 1,6-Hexanediol dimethcrylate | 11.1 |
| 2,4-Diethylthioxanthone | 0.3 |
| 2,6-Di-t-butyl-p-cresol | 0.6 |

The slip film obtained in B above was pressed onto the surface of the photosensitive resin composition in 2.70 mm thick prepared from the composition above with a handroller while facing the slip layer to the surface of the photosensitive resin composition, and the sample was cut off by 50 mm wide and 20 cm long. The peeling strength of the cover film during transcription of the slip layer from the cover film to the photosensitive resin composition was measured with Autograph (AGS-100A manufactured by Shimadzu Corporation) under conditions of 180° of peeling.

The above result was collectively shown in Table 5.

TABLE 5

| Surfactant | | | Evaluation of the appearance | Balance between adhesion-peeling strength (g/50 mm) and evaluation thereof | Evaluation of transcription |
|---|---|---|---|---|---|
| Type | Name | Concentration (% by weight) | | | |
| Fluorine type nonion surfactant | FC-171 (Note 1) | 0.25 | o | 4–6 | Bad |
| | | 0.2 | o | 5–8 | Bad |
| | | 0.1 | o | 6–10 | Good |
| | | 0.02 | o | 6–12 | Good |
| | | 0.005 | o | 6–12 | Good |
| | | 0.002 | X | 6–12 | Good |
| Silicone type surfactant | BYK-341 (Note 2) | 0.25 | X | 3–4 | Bad |
| | | 0.1 | o | 6–8 | Good |
| | | 0.02 | o | 6–10 | Good |
| Without surfactant | | – | X | 6–12 | Good |

(Note 1): Manufactured by Sumitomo 3 M
(Note 2): Manufactured by BYK JAPAN

Evaluation of appearance with eyes

○: No pinholes, no craters, no coating strips and no coating blurs

Δ Coating strips are seen at little

×: Pinholes, craters, coating strips and coating blurs are present

Balance between adhesion-peeling strength

Good: Peeling strength during transcription to the photosensitive resin composition is 5–15 g/50 mm.

Bad: Peeling strength during transcription to the photosensitive resin composition is below 5 g/50 mm.

It is clear from the result of Table 5 that the sample containing 0.005–0.2% of surfactant had excellent appearance and excellent balance of adhesion-peeling strength.

According to the present invention, a combination of materials of the slip layer for water-developing flexographic printing plate and optimum cover film, and a process for preparing applying films shows excellent appearance.

What is claimed is:

1. A water developable flexographic printing plate comprising a substrate, a photosensitive resin composition layer formed on the substrate, a slip layer formed on the photosensitive resin composition layer, and a cover film formed on the slip layer, wherein the slip layer comprises hydroxyalkyl methyl cellulose, the cover film is a matted film containing silica, an adhesive strength between the slip layer and the photosensitive resin composition layer is at least 20 g/50 mm higher than that between the cover film and the slip layer, and the photosensitive resin composition layer is water developable and consists essentially of:

(A) a hydrophilic crosslinked particulate copolymer prepared by polymerizing a monomer mixture consisting of
  (1) 10–95 mol % of an aliphatic conjugated diene,
  (2) 0.1–30 mol % of a monomer containing one or more functional groups selected from the group consisting of carboxyl group hydroxy group, sulfonic acid group and phosphoric acid group,
  (3) 0.1–20 mol % of a monomer having two or more addition polymerizable groups except for the aliphatic conjugated diene monomer (1), provided that (1)+(2)+(3)=100 mol %, (B) a thermoplastic block copolymer having an X-Y-X or X-Y structure and containing 1–40 mol % of a thermoplastic nonelastomer form block X showing a glass transition temperature of 20° C. or more and 60–99 mol % of an elastomer Y showing a glass transition temperature of 100° C. or less, (C) a basic nitrogen atom-containing compound, (D) a photopolymerizable unsaturated monomer, and (E) a photopolymerization initiator, and the adhesive strength of the photosensitive resin composition layer to the slip layer is more than 30 g/50 mm.

2. The printing plate according to claim 1 wherein the slip layer has a dry weight of 2.5 g/m$^2$ or more.

3. The printing plate according to claim 1 or 2 wherein the cover film is a polyester film showing a film surface roughness (Ra) of 0.01–1.0 μm and containing 0.005–5% by weight of silica particles with an average particle diameter of 0.05–10 μm.

4. The printing plate according to claim 3 wherein the slip layer is prepared by coating an aqueous solution comprising 0.5–10% by weight of hydroxyalkyl methyl cellulose, 0.005–0.2% by weight of a surfactant and water, or a mixture of water and organic solvent miscible with water, and then drying.

5. The printing plate according to claim 4 wherein the aqueous solution forming the slip layer further comprises dyestuff, pigment, or photoreactive material.

6. The printing plate according to claim 1 or 2 wherein the slip layer is prepared by coating an aqueous solution comprising 0.5–10% by weight of hydroxyalkyl methyl cellulose, 0.005–0.2% by weight of a surfactant and water, or a mixture of water and organic solvent miscible with water, and then drying.

7. The printing plate according to claim 6 wherein the aqueous solution forming the slip layer further comprises dyestuff, pigment, or photoreactive material.

* * * * *